United States Patent [19]
Geller

[11] Patent Number: 5,202,553
[45] Date of Patent: Apr. 13, 1993

[54] ENHANCED PERFORMANCE OPTICAL RECEIVER HAVING MEANS FOR SWITCHING BETWEEN HIGH AND LOW AMPLIFIER CONFIGURATIONS

[75] Inventor: William L. Geller, Foster City, Calif.
[73] Assignee: Raynet Corporation, Menlo Park, Calif.
[21] Appl. No.: 856,800
[22] Filed: Mar. 24, 1992
[51] Int. Cl.$^5$ ............................................. H01J 40/14
[52] U.S. Cl. .................... 250/214 A; 359/189
[58] Field of Search ....... 250/214 A, 214 AG, 214 C, 250/214 R, 206; 359/189, 190, 191, 192, 193, 194, 195; 330/51, 308

[56] References Cited
U.S. PATENT DOCUMENTS

| | | | |
|---|---|---|---|
| 4,792,998 | 12/1988 | Toussaint | 359/189 |
| 4,805,236 | 2/1989 | Urala | 359/189 |
| 4,808,810 | 2/1989 | Van Doorn | 250/214 A |
| 4,998,012 | 3/1991 | Krüse | 250/214 A |
| 5,012,202 | 4/1991 | Taylor | 359/194 |
| 5,030,925 | 7/1991 | Taylor | 330/308 |
| 5,138,148 | 8/1992 | Sakura | 250/214 A |

Primary Examiner—David C. Nelms
Assistant Examiner—John R. Lee
Attorney, Agent, or Firm—Dennis E. Kovach

[57] ABSTRACT

A transimpedance front end is provided for an optical receiver which includes a photodetector coupled optically to an optical fiber for receiving optical signals over the fiber and connected electrically to the front end. The front end comprises a buffer amplifier connected to the photodetector, a first amplifier selectively connected to the buffer through a first switch and through a first, high value feedback resistor in order to define a first mode low optical signal level amplifier configuration, a second amplifier selectively connected to the buffer through a second switch and through a second, switched low value resistor to define a second mode high optical signal level amplifier configuration, and an optical level sensing and switching control circuit connected to the photodetector for sensing incoming optical signal level and for switching between the first and second amplifier configurations as a function thereof.

10 Claims, 3 Drawing Sheets

ENHANCED PERFORMANCE OPTICAL RECEIVER HAVING MEANS FOR SWITCHING BETWEEN HIGH AND LOW AMPLIFIER CONFIGURATIONS

FIELD OF THE INVENTION

The present invention relates to an opto-electronic receiver apparatus for use in an optical fiber communications network. More particularly, the present invention relates to methods and apparatus for achieving an optical receiver with increased dynamic range.

BACKGROUND OF THE INVENTION

Transimpedance amplifiers are employed in optical receivers in order to convert very small currents indicative of optical signals applied to photodiode detectors. These small currents are then converted to signal voltages of greater amplitude. In an optical fiber communications network whereby a plurality of geographically distributed users each write onto a common optical fiber, incoming optical signals from a nearby transmitter may be detected at a high signal level, whereas incoming optical signals received from a distant transmitter may be detected at very low signal levels. Thus, to be effective, a transimpedance front end of the optical receiver must be sufficiently sensitive effectively to receive the weakest optical signals and must also be controllable to receive the strongest optical signals without reaching saturation and resultant distortion in the detected signal voltages.

High sensitivity and high saturation level are contradictory requirements for a transimpedance front end of an optical receiver. A simplified representation of a typical transimpedance front end of an optical receiver is illustrated in FIG. 1. With reference to the FIG. 1 configuration, if the amplification factor $-A$ is sufficiently large, the transimpedance is equivalent to the feedback resistance $R_L$. On one hand, for high sensitivity the $R_L$ value should be large because the noise current introduced by the feedback resistor is inversely proportional to the resistor value. On the other hand, to realize a high saturation level, the value of $R_L$ should be small in order to limit signal excursion.

Techniques reported in the prior art for increasing dynamic range improvement typically involve the use of active devices at sensitive nodes of the transimpedance amplifier. One example is given in FIG. 2. In FIG. 2, an FET device is provided at the input of the amplifier to shunt away photo current at high signal levels to prevent saturation of the amplifier. In FIG. 3, an FET device is shunted across a portion $R_{L1}$ of the feedback resistor $R_L$ in order to lower the value thereof at high signal levels. The FET devices employed in these prior art examples are placed at sensitive nodes, i.e. the input of the amplifier in FIG. 2 and across the feedback resistor in FIG. 3. The FET devices add parasitic capacitances into the amplifier circuit, and these parasitics have a significant effect upon the performance of the overall amplifier circuit. In order to minimize the effect of the parasitics, the characteristics of the FET devices must be chosen carefully and tightly controlled within a narrow tolerance. Usually, the FET devices have been incorporated into an integrated circuit amplifier wherein the design of the active device may be customized for a particular application.

Neither of the techniques illustrated in FIGS. 2 or 3 for extending the dynamic range of an optical receiver is convenient if the designer is limited to standard "off the shelf" discrete circuit components and elements.

SUMMARY OF THE INVENTION WITH OBJECTS

A general object of the present invention is to provide a transimpedance front end of an optical receiver with increased dynamic range in a manner overcoming limitations and drawbacks of the prior art.

Another object of the present invention is to realize a transimpedance front end for an optical receiver with standard "off-the-shelf" electronic components, with a minimum of circuit complexity, without a need for special adjustments or compensation and at relatively very low cost.

In accordance with the present invention, a transimpedance front end is provided for an optical receiver which includes a photodetector coupled optically to an optical fiber for receiving optical signals over the fiber and connected electrically to the front end. The front end comprises a buffer amplifier connected to the photodetector, a first amplifier selectively connected to the buffer through a first switch and through a first, high value feedback resistor in order to define a first mode low optical signal level amplifier configuration, a second amplifier selectively connected to the buffer through a second switch and through a second, switched low value resistor to define a second mode high optical signal level amplifier configuration, and an optical level sensing and switching control circuit connected to the photodetector for sensing incoming optical signal level and for switching between the first and second amplifier configurations as a function thereof.

In accordance with related principles of the present invention, a method is provided for receiving a wide dynamic range of optical signals within an optical receiver including a photodetector, an incoming optical signal level detector, a control signal generator, and first and second switchable transimpedance amplifiers. The method comprises the steps of:

sensing incoming optical signal level with the optical signal level detector, generating a switching control signal with the control signal generator as a function of detected incoming optical signal level, and switching between the first and second switchable transimpedance amplifiers in accordance with the switching control signal.

According to yet another aspect of the invention, a transimpedance front end is provided whereby a switch is incorporated into the amplifier to selectively switch between an open and closed circuit configuration dependent on a sensed current level to be amplified, with first and second separate and independent amplifiers being provided and first and second separate and independent feedback resistors being provided so that one amplifier is capable of operating during one mode (low gain) and the other amplifier is capable of operating during another mode (high gain). The low gain amplifier and feedback resistor comprise passive and active components which are all separate from those forming the high gain amplifier and feedback resistor (except for interconnect conductors).

These and other objects, advantages, aspects and features of the present invention will be more fully understood and appreciated upon consideration of the following detailed description of preferred embodiments, presented in conjunction with the accompanying drawings.

DETAILED DESCRIPTION OF THE PREFERRED EMBODIMENT

Figure 1:
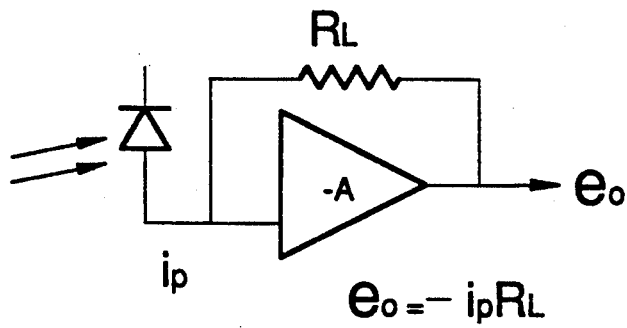
FIG. 1 is a simplified block and schematic circuit diagram of a conventional transimpedance front end of an optical receiver.
Figure 2:
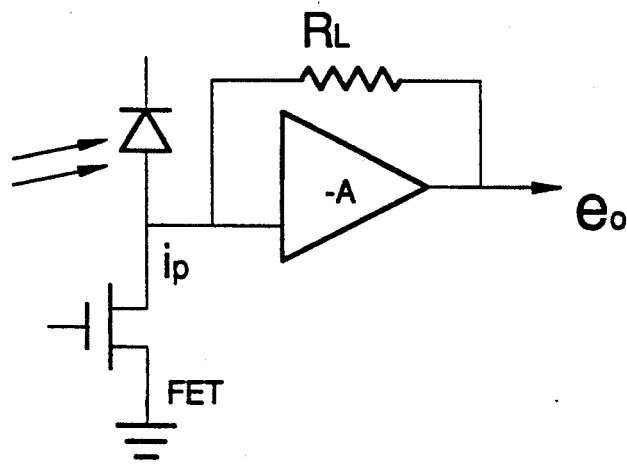
FIG. 2 is a simplified block and schematic circuit diagram showing one approach of the prior art for extending the dynamic range of the FIG. 1 front end.
Figure 3:
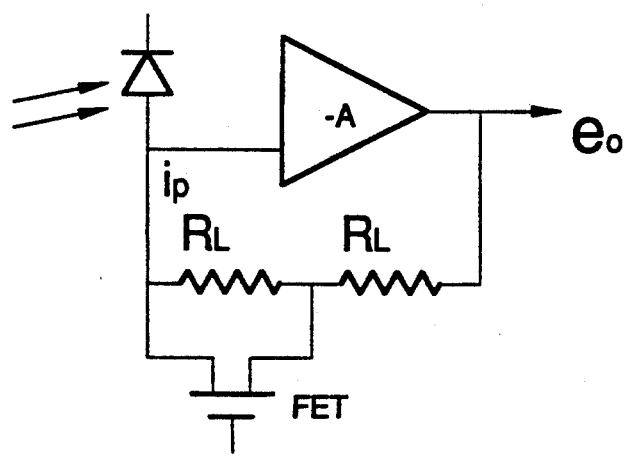
FIG. 3 is a simplified block and schematic circuit diagram showing another approach of the prior art for extending the dynamic range of the FIG. 1 front end.
Figure 4:
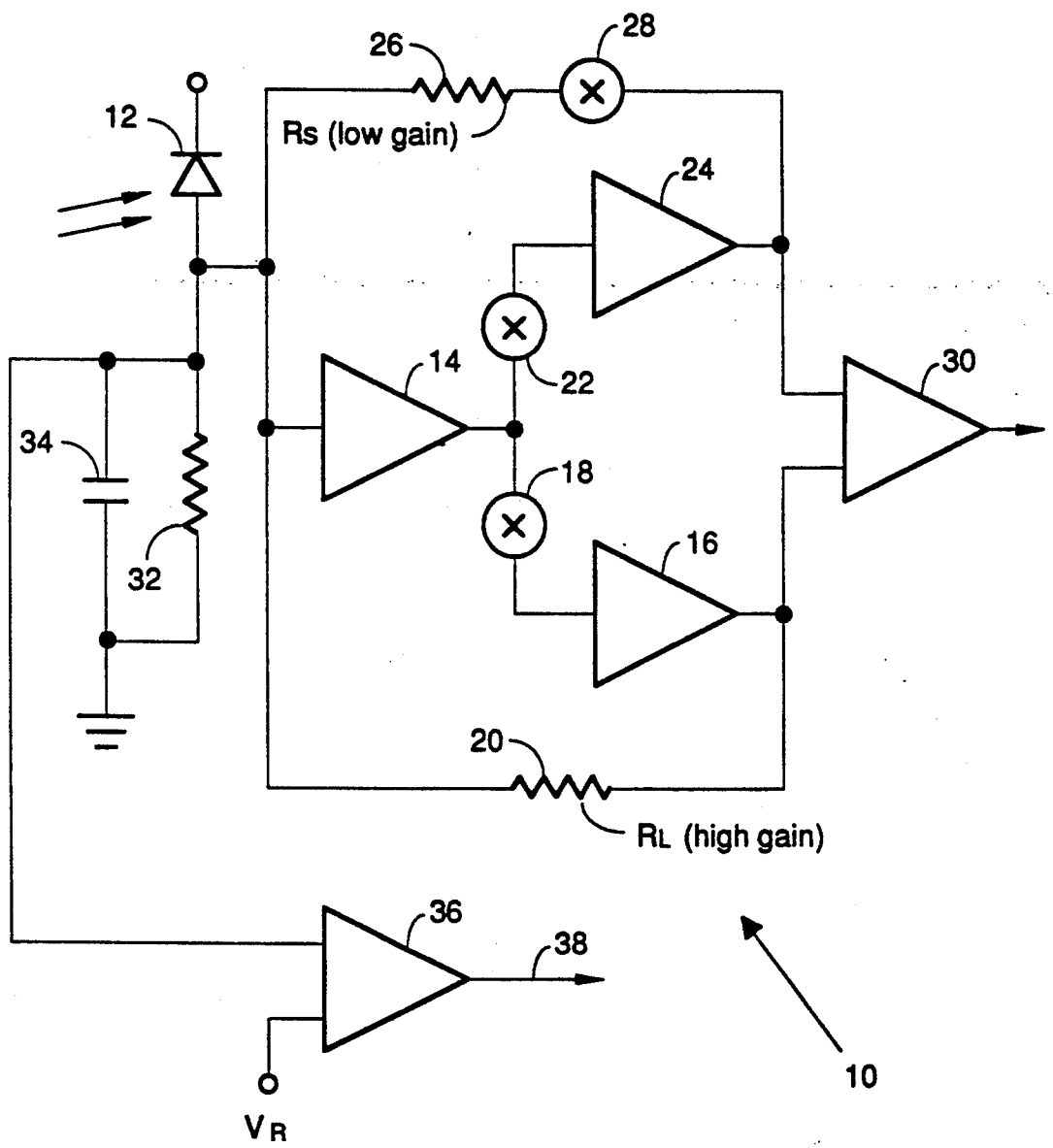
FIG. 4 is a simplified block and schematic circuit diagram illustrating a transimpedance front end of an optical receiver incorporating principles of the present invention.

FIG. 4 illustrates in overview an improved transimpedance front end 10 of an optical receiver which achieves extended dynamic range while employing standard, low cost transistors and other components in a non-critical manner. A photodiode 12 is connected to the input of a buffer amplifier 14. In a first operational mode adapted to high gain amplification of low signal levels, the buffer amplifier 14 connects to an amplifier 16 through a switch 18. The amplifiers 14 and 16 form a transimpedance amplifier by virtue of a feedback resistor 20 which has a relatively large value.

When the detected optical signal reaches a value where maximum sensitivity is no longer required, the first operational mode including amplifiers 14 and 16 is discontinued, and a second operational mode suitable for handling large magnitude optical signals without saturation is established. In the second mode, a transimpedance amplifier is obtained by the configuration of the buffer 14 and an amplifier 24 connected to the buffer 14 via a switch 22. A small value feedback resistor 26 is also connected via a switch 28 from the output of the amplifier 24 to the input of the buffer 14. By substituting the second mode configuration with the low value feedback resistor 26, the saturation level of the transimpedance front end 10 is extended. Since the optical signal is now large, the low value of the resistor 26 does not adversely affect overall performance of the optical receiver. Signal voltage output is provided via an analog demultiplexer circuit 30.

An optical level detector includes a sense resistor 32 and a capacitor 34 which are connected to receive the photo current input from the photodiode 12. The sense resistor develops a voltage which is proportional to the average photo current and this voltage is compared with a reference voltage $V_R$ by a comparator circuit 36. The comparator 36 provides a control output 38 which operates the switches 18, 22 and 28 to switch the front end 10 from the first mode to the second mode when the incoming optical signal level exceeds the reference voltage $V_R$ which is a known, preset value, and similarly the comparator operates the switches to switch the front end 10 from the second mode to the first mode when the overage value of the incoming signal falls below the reference voltage $V_r$.

The capacitor 34 along with resistor 32 provide a sufficiently long time constant so that the sense voltage represents the average optical signal power. Also, hysteresis is provided in the switch control function so that the control does not dither between the two operational modes.

Figure 5:
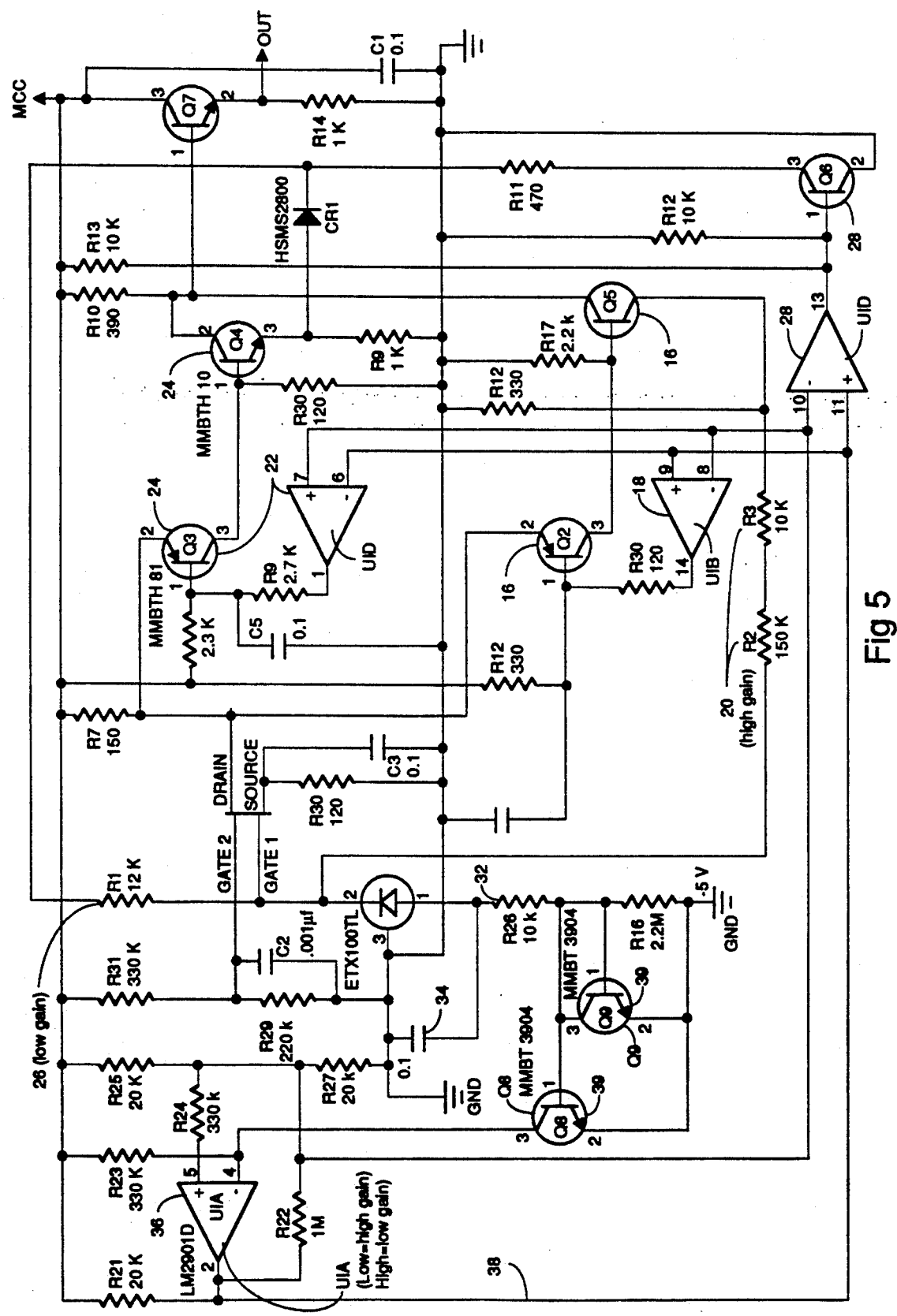
FIG. 5 is a more detailed schematic circuit diagram of the FIG. 4 transimpedance front end.

FIG. 5 provides a practical implementation of the FIG. 4 circuit 10. The same reference numerals employed above to describe FIG. 4 are also employed to identify corresponding functional areas and elements of the FIG. 5 circuit implementation. In the FIG. 5 example, three switch transistors Q2, Q3, and Q6 switches between essentially an open circuit and closed circuit state depending on the sensed current level to be amplified. Transistor Q2 switches amplifier 16 and high gain resistor 20, Q3 switches amplifier 24, and Q6 switches low gain resistor 26.

Transistor Q8 and Q9, 39 form a "current mirror" which reflects the photocurrent representing the average optical signal power into the comparator circuit 36.

The buffer amplifier 14 is implemented as a GaAs MESFET transistor Q1. In the first operational configuration for low optical signal levels, the buffer Q1 is coupled to amplifier 16 formed by NPN transistor Q5 and PNP transistor Q2 through the switch 18 including PNP transistor Q2 and comparator 18 (U1B). Transistor Q2 acts in a dual role as part of amplifier 16 and switch 18.

For low level signals below a reference voltage level set by the comparator 36 (implemented as a first one U1A of a four open-collector comparator array, such as type LM 2901), the output control signal on line 38 is low. This causes the output of the comparator U1B to be low and the switch transistor Q2 to be conducting, resulting in coupling of the output from the buffer Q1 to the base of transistor Q5.

At the same time, the low gain configuration formed by circuit elements 22, 24, 26 and 28 is inactive. Switch 22 includes a third comparator U1D which controls the base of an PNP switch transistor Q3. In the high gain configuration, the output of the third comparator U1D is high, causing the transistor Q3 to be in a high impedance state thereby causing Q4 to cut off and causing diode CR1 to be reversed biased. Similarly, the switch 28 disconnects the low value resistor 26 (12K ohm) from ground (Grd). The switch 28 includes a fourth comparator U1C, a switching transistor Q6 and diode CR1. In this mode the output of the fourth comparator U1D is low which removes the base bias from the transistor Q6, and Q6 also presents a high impedance. The net effect is to eliminate any conduction path for current through the low value resistor 26. Thus, the first operational mode results in a sensitive, high gain transimpedance amplifier comprising the FIG. 5 elements Q1, Q2, Q5, Q7 and feedback resistor 20 configured as a 150K and 10K resistor in series. The output buffer 30 comprising the element Q7 and wire "O-ring" of Q5 and Q4 operating in this first circuit configuration.

When the optical signal reaches a significant level, such as −26 dBm, the level detector 36 (U1A) changes from low to high. U1B now goes high, turning off Q2 and opening the path between the buffer transistor Q1 and the amplifier 16 (Q2, Q5). This disables the high gain configuration. Concurrently, the switch 22 turns on, thereby connecting the buffer Q1 to amplifier 24 (comprising an PNP transistor Q3 and the NPN transistor Q4). Also switch 28 turns on (U1D goes high, forward biasing transistor Q6, which also causes the emitter-base junction of transistor Q5 to become forward biased, resulting in connection of the low value resistor 26 in the circuit. The low gain amplifier configuration (resistor 26, Q3, Q4) is now activated, thereby increasing the saturation level of the optical receiver. As with the high gain amplifier configuration, transistor Q2 acts as a dual role as part of amplifier 24 and switch 22.

With the dual mode optical receiver thus realized, a sensitivity of −43 dBm, a saturation level of −10 dBm, and an overall dynamic range of 33 dB is realized. The FIG. 5 circuit implementation is realized with standard off-the-shelf components. The NPN transistors Q4, Q6, and Q7 may be type MPSH 10 or equivalent. The PNP transistors Q2, Q3, may be type MPSH 81 or equivalent. The quad comparator implementing U1A, U1B, U1C and U1D may be type LM2901, or equivalent. The other circuit elements have the values associated proximately with their symbols as shown in FIG. 5.

To those skilled in the art to which the present invention pertains many widely differeng embodiments will be suggested by the foregoing without departing from the spirit and scope of the present invention. The descriptions and disclosures herein are intended solely for purposes of illustration and should not be construed as limiting the scope of the present invention which is more particularly pointed out by the following claims.

What is claimed is:

1. A transimpedance front end for an optical receiver including a photodetector coupled optically to an optical fiber for receiving optical signals over the fiber and connected electrically to the front end, the front end comprising:
   a buffer connected to the photodetector,
   a first amplifier selectively connected to the buffer through first switching means and through first high value feedback resistor means to define a first mode low optical signal level amplifier configuration,
   a second separate amplifier selectively connected to the buffer through second switching means and through second switched low value feedback resistor means to define a second mode high optical signal level amplifier configuration, and
   optical level sensing and switching control means connected to the photodetector for sensing an incoming optical signal level and for switching between the first and second amplifier configurations as a function thereof.

2. The transimpedance front end claimed in claim 1, each amplifier configuration comprising at least two amplification transistors.

3. The transimpedance front end claimed in claim 1, the first amplifier configuration utilizing a first transistor in a dual mode as a switch to selectively connect the first amplifier configuration to the buffer and as an amplification transistor to amplify a signal when the first amplifier configuration is selectively connected to the buffer, the second amplifier configuration utilizing a second transistor in a dual mode as a switch to selectively connect the second amplifier configuration to the buffer and as an amplification transistor to amplify a signal when the second amplification configuration is connected to the buffer.

4. The transimpedance front end claimed in claim 3, each amplifier configuration including a separate additional amplification transistor.

5. The transimpedance front end claimed in claim 3, each amplifier configuration including a comparator having an output coupled to its respective dual mode transistor, an input of the comparator being connected to the optical level sensing and switching control means.

6. The transimpedance front end claimed in claim 3, the second switching means further including a third switching transistor for selectively switching a connection with the low value transistor means between essentially an open circuit and closed circuit configuration.

7. The transimpedance front end claimed in claim 1, the optical level sensing and switching control means including means for averaging a value of a sensed optical signal level and including time constant means sufficiently long to prevent dither switching between the first and second level amplifier configurations.

8. The transimpedance front end claimed in claim 1, the high value feedback resistor means defining a resistive feedback path which does not include any part of a resistive feedback path of the low value feedback resistor means.

9. A transimpedance front end for an optical receiver including a photodetector coupled optically to an optical fiber for receiving optical signals over the fiber and connected electrically to the front end, the front end comprising:
   an input node connecting to the photodetector,
   a buffer transistor having a base electrode connected to the input node and having a collector output,
   first switching means including a first switch transistor having an emitter-collector signal path connected to said collector output, and a first comparator for controlling a base electrode of said first switch transistor in accordance with a switching control signal,
   first transistor amplifier means having an input connected to the emitter-collector signal path of the first switch transistor and having an output connected to an output buffer,
   high value feedback resistor means connected from the output of the first transistor amplifier means to the input node,
   second switching means including a second switch transistor having an emitter-collector signal path connected to said collector output, and a second comparator for controlling a base electrode of said second switch transistor in accordance with the switching control signal,
   second transistor amplifier means having an input connected to the emitter-collector signal path of the second switch transistor and having an output connected to the output buffer,
   low value feedback resistor means connected from the output of the second transistor amplifier means through third switching means to the input node, the third switching means including a third switch transistor and a third comparator for controlling a base electrode of the third switch transistor means in accordance with the switching control signal, and
   optical level sensing and switching control means connected to the photodetector for sensing an incoming optical signal level and for generating and putting out the switching control signal as a function of the sensed optical level.

10. A method for receiving a wide dynamic range of optical signals within an optical receiver including a photodetector, an incoming optical signal level detector, a switching control signal generator, and first and second separate switchable transimpedance amplifiers, the first and second amplifiers each including a feedback path, the first amplifier including a high gain feedback path, the second amplifier including a low gain feedback path, the method comprising the steps of:
  sensing an incoming optical signal level with the optical signal level detection means,
  generating a switching control signal with the switching control signal generation means as a function of the incoming optical signal level, and
  switching between the first and second separate switchable transimpedance amplifiers in accordance with the switching control signal.

* * * * *